United States Patent
Bojarczuk, Jr. et al.

(10) Patent No.: US 6,933,566 B2
(45) Date of Patent: Aug. 23, 2005

(54) METHOD OF FORMING LATTICE-MATCHED STRUCTURE ON SILICON AND STRUCTURE FORMED THEREBY

(75) Inventors: Nestor Alexander Bojarczuk, Jr., Poughkeepsie, NY (US); Matthew Warren Copel, Yorktown Heights, NY (US); Supratik Guha, Chappaqua, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/059,422

(22) Filed: Jan. 31, 2002

(65) Prior Publication Data

US 2003/0008521 A1 Jan. 9, 2003

Related U.S. Application Data

(63) Continuation-in-part of application No. 09/898,039, filed on Jul. 5, 2001.

(51) Int. Cl.7 .......................... H01L 27/01; H01L 27/12
(52) U.S. Cl. ......................................... 257/347; 257/15
(58) Field of Search ................ 438/752, 149, 438/295, 400, 404, 479, 406, 407, 413, 482, 517, 528, 144; 428/446, 700–701; 365/145; 257/347, 9, 15; 258/347

(56) References Cited

U.S. PATENT DOCUMENTS

| | | | | |
|---|---|---|---|---|
| 3,986,197 A | | 10/1976 | Ablassmeier | |
| 4,891,329 A | * | 1/1990 | Reisman et al. | 438/459 |
| 4,980,339 A | * | 12/1990 | Setsune et al. | 505/235 |
| 5,248,564 A | * | 9/1993 | Ramesh | 428/688 |
| 5,478,653 A | * | 12/1995 | Guenzer | 428/446 |
| 5,847,419 A | * | 12/1998 | Imai et al. | 257/192 |
| 6,096,434 A | | 8/2000 | Yano et al. | |
| 6,248,621 B1 | * | 6/2001 | Wilk et al. | 438/237 |
| 6,258,459 B1 | * | 7/2001 | Noguchi et al. | 428/446 |
| 6,376,337 B1 | | 4/2002 | Wang et al. | |
| 6,610,548 B1 | * | 8/2003 | Ami et al. | 438/3 |

OTHER PUBLICATIONS

"Crystalline Oxides on Silicon: The First Five Monolayers", Rodney A. McKee et al., Physical Review Letters, vol. 81, No. 14, Oct. 5, 1998, pp. 3014–3017.

"Epitaxial Ceo2 on Silicon Substrates and the Potential of Si/ceo2/si for SOI Structures", A.H. Morshed et al., Mat. Res. Soc. Symp. V474,339(1197).

J. Haeni, D.G. Schlom, Materials Research Society 2001 Meeting, Apr. 2001, San Francisco, "LaAl03 Derivative Structures for Alternative Gate Dielectrics".

* cited by examiner

Primary Examiner—Phat X. Cao
Assistant Examiner—Theresa T. Doan
(74) Attorney, Agent, or Firm—Wan Yee Chaung, Esq.; McGinn & Gibb, PLLC

(57) ABSTRACT

A method (and resultant structure) of forming a semiconductor structure, includes processing an oxide to have a crystalline arrangement, and depositing an amorphous semiconductor layer on the oxide by one of evaporation and chemical vapor deposition (CVD).

31 Claims, 2 Drawing Sheets

METHOD OF FORMING LATTICE-MATCHED STRUCTURE ON SILICON AND STRUCTURE FORMED THEREBY

CROSS-REFERENCE TO RELATED APPLICATIONS

The present application is a continuation-in-part of U.S. patent application Ser. No. 09/898,039, to Bojarczuk et al., filed on Jul. 5, 2001, incorporated herein by reference.

BACKGROUND OF THE INVENTION

1. Field of the Invention

The present invention generally relates to an insulator, and more particularly to a lattice-matched epitaxial insulator structure formed on silicon, and arbitrarily grown, lattice-matched epitaxial insulator-silicon and germanium structures grown on top of each other.

2. Description of the Related Art

Prior to the present invention, there has not been any demonstrated lattice-matched epitaxial insulator structure formed on silicon where the lattice constant of the oxide can be varied arbitrarily so that it is equal to, or an integral multiple of the lattice constant of silicon. However, such lattice-matched epitaxial insulator structures on Si are needed for various reasons.

Firstly, such insulators can be used as gate dielectrics for Si complementary metal oxide semiconductor (CMOS) transistors with the view that an epitaxial structure will be less defective. Such epitaxial structures based on $SrTiO_3$-type perovskite structures have been grown as described in "Crystalline Oxides on Silicon: The First Five Monolayers", Rodney A. McKee et al., Physical Review Letters, Volume 81, Number 14, Oct. 5, 1998, pp. 3014–3017.

However, these structures have a lattice mismatch that is about 2% off from that of Si. These oxide films are grown on Si surfaces that are oriented in the <100> crystalline direction and while they are aligned in the plane of growth to the spacing of the silicon atoms in the <110> directions in the growth plane to a small level of lattice mismatch, they exhibit a large lattice mismatch to the silicon in the direction perpendicular to the growth plane. Epitaxial structures can also be made with $Y_2O_3$ but the lattice mismatch is about 2.5%.

Secondly, such insulators can be used for fully epitaxial Si/insulator/Si epitaxial structures or epitaxial Ge/insulator/Ge epitaxial structures. There have been no prior reports of successful growth of Si/oxide/Si epitaxial structures with a flat interfacial and surface profile for thin (less than about 50 nm) epitaxial layers. These structures can be used for a variety of different applications such as, for example, silicon-on-insulator (SOI) structures or germanium-on-insulator (GOI) structures for transistors, double-gated FET structures, and novel optical and optoelectronic devices.

Thus, prior to the invention, gate dielectrics/insulators have been provided that are epitaxial, but not lattice-matched. However, these dielectrics/insulators are still problematic as lattice mismatch induced defects are created in the devices (e.g., CMOS FET) incorporating such structures. These defects act as traps and affect the turn-on of the device (transistor), as well as the stability and mobility of the device.

In addition, prior to the present invention, no Si substrate/ epitaxial oxide/epitaxial silicon structures have been grown that have smooth and uniform surfaces and interfaces for ultrathin layer thicknesses (<50 nm). There has been one report (e.g., see "Epitaxial $CeO_2$ on Silicon Substrates and the Potential of Si/$CeO_2$/si for SOI Structures", A. H. Morshed et al. Mat. Res. Soc. Symp. V474, 339(1197)) of attempting to grow epitaxial Si films on $CeO_2$(cerium oxide). However, the Si growth profile was rough and three dimensional and the silicon was not completely epitaxial in nature.

Thus, prior to the present invention, there has not been any lattice-matched epitaxial insulator-silicon structure formed on silicon which is substantially defect-free and uniform, nor has the advantages of such a structure been recognized prior to the present invention. This is also the case for lattice matched epitaxial insulator-germanium structures.

SUMMARY OF THE INVENTION

In view of the foregoing and other problems, drawbacks, and disadvantages of the conventional methods and structures, an object of the present invention is to provide a lattice-matched epitaxial insulator structure formed on silicon and a method of forming the same.

In a first aspect of the present invention, a method (and resultant structure) of forming a semiconductor structure, includes processing an oxide to have a crystalline arrangement, and depositing an amorphous semiconductor layer on the oxide by one of evaporation and chemical vapor deposition (CVD).

In the present invention, an optimum method is provided for depositing silicon (or other semiconductor) layers on top of the lattice matched oxide layer.

In such a method, the mixed rare earth oxide layer is cooled down to between room temperature and 100 C following which a thin silicon (or other semiconductor) layer is deposited on top of the epitaxial oxide film surface by evaporation. Since the deposition temperature is low, the as-deposited silicon (or other semiconductor) has an amorphous microstructure. A key aspect to this deposition is that the substrate temperature is low enough that the deposited silicon (or other semiconductor) assumes an amorphous microstructure.

Thereafter, the amorphous silicon (or other semiconductor)/oxide/silicon structure is gradually heated up to a temperature where the silicon (or other semiconductor) starts crystallizing epitaxially. In this case, the seed for epitaxial crystallization is provided by the underlying crystalline oxide template.

Above approximately 550C, the amorphous silicon (or other semiconductor) layer transforms to a single crystal epitaxial layer due to solid phase epitaxial growth seeded by the oxide surface below.

In order for the solid phase epitaxy to proceed with a smooth silicon (or other semiconductor) surface, the annealing for solid phase epitaxy can be achieved in the presence of a vapor or flux of a surfactant such as antimony.

It is noted that the solid phase epitaxy of silicon (or another semiconductor material) itself is not new. Also, the growth of a semiconductor in the presence of a surfactant is known. Instead, some novel aspects here include: (i) in this case the solid phase epitaxy of the silicon (or other semiconductor) is seeded by this novel crystalline oxide that has been grown underneath, and (ii) also that the solid phase epitaxy on this oxide surface is carried out in the presence of a vapor of a surfactant. The surfactant alters the surface energy of the silicon (or other semiconductor), such that it does not roughen as a result of the solid phase epitaxy.

Once the solid phase epitaxy has proceeded to completion, at the substrate temperature of above about 550 C (or another temperature if another semiconductor is used), the surfactant vapor can be turned off.

The above process can be substantially identically performed with germanium (or a silicon-germanium mixture) instead of silicon to make germanium/oxide heterostructures.

The present inventors have grown Ge and Si by this process on a specific oxide layer (i.e., LaY-oxide and Y-oxide). However, this will work on any crystalline oxide that shares some surface symmetry with Si or Ge. Thus, the invention advantageously provides a unique solid phase epitaxial process where the Si or Ge is grown in this fashion on any such crystalline oxide.

With the unique and unobvious aspects of the invention, a lattice-matched epitaxial insulator structure is formed on silicon. These structures can be used for a variety of different applications such as, for example, silicon-on-insulator structures for transistors, double-gated FET structures, and novel optical devices.

The inventive compound has a lattice constant which is preferably twice that of silicon, and thus it is a multiple such that everything "fits". The insulator also possessed a high band-gap (>5 eV), a high permittivity (>10) and a low electrical current leakage. As a result, various band gap engineered thin film heterostructures with silicon may be conceived. Some of these devices have been mentioned above, but are re-emphasized below.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
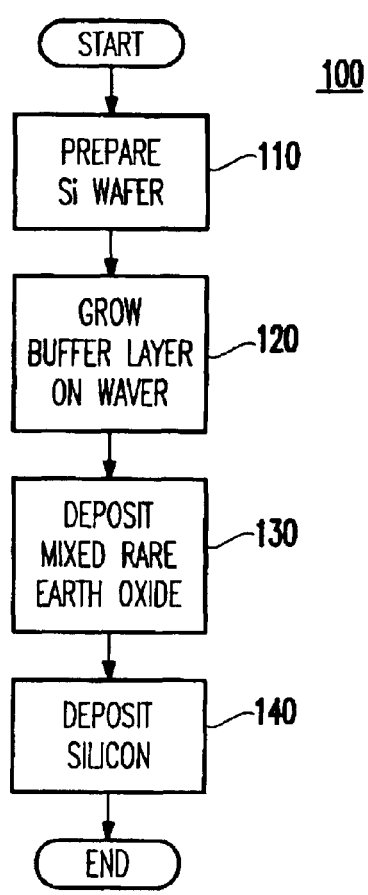
FIG. 1 illustrates a flowchart of the method 100 according to the present invention.

Referring now to the drawings, and more particularly to FIGS. 1–4, there are shown preferred embodiments of the method and structures according to the present invention.
Preferred Embodiment Prior to turning to the details of the invention, it is noted that the present invention has provided a new material, $(La,Y)_2O_3$ that can be closely matched to the Si lattice for epitaxial growth.

That is, Yttrium oxide is a well-known oxide which has a cubic bixbyite (e.g., "bixbyite" refers to a specific cubic, crystallographic structure) structure with a lattice constant of 1.06 nm, which is about 2.4% smaller than two times the lattice constant of silicon. As a result, when one grows thin films of $Y_2O_3$ on silicon, the deposition has epitaxial characteristics but is not of good quality (e.g., defects are created).

Further, lanthanum oxide ($La_2O_3$) is a well-known oxide which has a larger La to O bond length, since La is a larger atom. However, under normal circumstances $La_2O_3$ crystallizes with a hexagonal structure and cannot be lattice-matched to silicon.

There has been reported a cubic bixbyite $La_2O_3$ phase, and it has a lattice constant of 1.138 nm. However, it is not a stable phase under normal pressure and room temperature.

Thus, these known compounds are problematic. The present invention provides a new compound which overcomes the problems of these and other compounds, as discussed below.

That is, in the present invention, a new, metastable $(La_xY_{1-x})_2O_3$ alloy has been created. This alloy, at around x=0.3, will be perfectly lattice-matched to silicon and will crystallize in the cubic structure. That is, in its most basic form, as shown in the structure 200A of FIG. 2A, includes the novel compound 230 grown on a silicon substrate 210, as described in further detail below.

In spite of the tendency for $La_2O_3$ to crystallize hexagonally, the cubic modification occurs due to crystal structure stabilization from the Y-containing oxide and epitaxial stabilization from the Si substrate. At x=0.33, the lattice constant of the alloy will be 1.086 nm (i.e., exactly the same as Si). This follows from a linear interpolation between the $La_2O_3$ lattice constant of 1.138 nm, the $Y_2O_3$ lattice constant of 1.06 nm, and using Vegard's law.

The present inventors have demonstrated that by straightforward molecular beam epitaxy (MBE), an epitaxial film of good quality may be grown on silicon by depositing $(La_xY_{1-x})_2O_3$. This shows bright, reconstructed reflection high energy electron diffraction patterns typically observed in good epitaxial growth. X-ray diffraction of such layers also indicate that they are epitaxial, single crystal in nature, and of very high quality. It is noted that the invention does not rely on MBE, but instead can employ other types of growth techniques.
Second Embodiment Further, to the compound described in the first embodiment, in another aspect of the invention, the present inventors have also discovered that, after growing the epitaxial $(La,Y)_2O_3$ layer on silicon (e.g., described below in further detail and shown in step 140 of FIG. 1), an epitaxial Si layer can be further grown directly on top of this epitaxial $(La,Y)_2O_3$ layer. Such epitaxial growth can be performed by MBE. This is again clearly observed from in-situ reflection high energy electron diffraction patterns. These patterns indicate that a smooth, reconstructed silicon surface may be obtained.

This is the first time a silicon/oxide/silicon structure has been grown epitaxially with such a smooth reconstructed surface. The surface however becomes smooth only after about 50 nm of growth, while for many applications, smooth layers much thinner than this are required. Additionally, these thick layers contain large densities of extended defects.

EXAMPLE

Turning to FIG. 1, the method 100 of the invention will be described hereinbelow. First, in step 110, a wafer was prepared. That is, a clean Si wafer was taken and dipped in a hydrofluoric acid solution in order to produce a hydrogen-passivated surface. The wafer orientation is preferably <111>, but it can also be <100> or <110>. The wafer may have a thickness within a range of about 1 $\mu$m to about 10000 $\mu$m. However, it is noted that any thickness may be used, as the thickness of the wafer is not relevant to the invention. Alternatively, one Si wafer may not be hydrogen passivated and can retain a thin (2 nm or less) silicon dioxide layer on its surface.

Then, the wafer was loaded into a vacuum deposition system and heated to about 600 C in order to desorb the H from the surface and clean it up. It is also possible to heat the wafer to 1000° C. to clean it further, but such a step is not critical.

Following preparation of the Si surface, in step 120, an epitaxial Si buffer was grown on top of the Si wafer resulting in a clean and smooth surface. However, this step is not essential for the process (e.g., the Si buffer layer is optional).

If the silicon buffer layer is grown, then the starting surface should be a clean, oxide-free surface. On the other hand, if the $L_aY$ oxide is to be deposited, then it could be deposited directly on top of the thin (<2 nm) silicon oxide, or on an oxide-free silicon surface. In this example of the present invention, the vacuum chamber for deposition was a standard molecular beam epitaxy chamber. The buffer layer may have a thickness within a range of about 0.5 nm to about 1 micron or more.

In step 130, the $(La,Y)_2O_3$ (or another mixed rare earth oxide as mentioned below) is now ready for deposition. La and Y are heated using standard high temperature commercial effusion cells. Typical La and Y cell operation temperatures are 1300–1700 C. Depending upon the specific cell temperature, the element fluxes can be controlled (as is typical in a standard molecular beam deposition process) and thereby the relative composition of La:Y can be controlled in the deposited film. Oxygen is provided by a molecular oxygen beam. Alternatively, radio frequency (RF) excited atomic oxygen can be provided as well, or in place of molecular oxygen.

With the La and Y cells raised to the appropriate temperature, and an oxygen flow rate of about 1–3 sccm, so that the chamber pressure is in about the 1E-5 to 1E-4 range, the epitaxial growth of $(La,Y)_2O_3$ was commenced by opening the La and Y shutters with the substrate facing all three sources (e.g., La, Y, and O). The substrate temperature is typically about 650 C, but can be anywhere in the 400–800 C range. Epitaxial growth of $(La,Y)_2O_3$ now occurred. Films have been grown with compositions from 0<x<0.5 for the compound $(La_xY_{1-x})_2O_3$. The lattice matching occurs at around x=0.3. Remarkably, single crystal films will grow even through a thin $S_1O_2$ layer is on the Si surface When the Si wafer orientation was (001), the LaY-oxide was grown with its (011) direction normal to the film surface. When the Si wafer orientation was (011), the LaY-oxide was grown with its (111) direction normal. When the Si wafer orientation was (111), the LaY-oxide orientation was normal to the film surface was (111).

Therefore, in the first case, one obtains a two domain epitaxial growth, and in the other two cases, it is possible to get true epitaxial growth.

For epitaxial deposition on Si(111), near-lattice matched LaY-oxides may be grown with a (222) x-ray diffraction full width at half maxima of about 130 arc seconds which indicates the high quality nature of the growth. The inventive compound $(La_xY_{1-x})_2O_3$ may have a thickness within a range of about 0.5 nm to more than 1 micron. Again, the thickness thereof is not relevant to the invention.

Following deposition of the oxide, the vacuum chamber was pumped down to about $10^{-9}$ torr to reduce background oxygen pressures.

Then, in step 140, epitaxial silicon was deposited onto the oxide surface by keeping the substrate at 650–700 C and evaporating the Si from an electron beam source. The silicon was deposited epitaxially as clearly observed from reflection high energy electron diffraction images. The epitaxial silicon layer may have a thickness within a range of about 0.5 nm to about more than 1 $\mu$m. Again, the thickness is not relevant.

Hereinabove, a general method is described for depositing silicon (or another semiconductor) layers on top of the lattice matched oxide layer.

Figure 4:
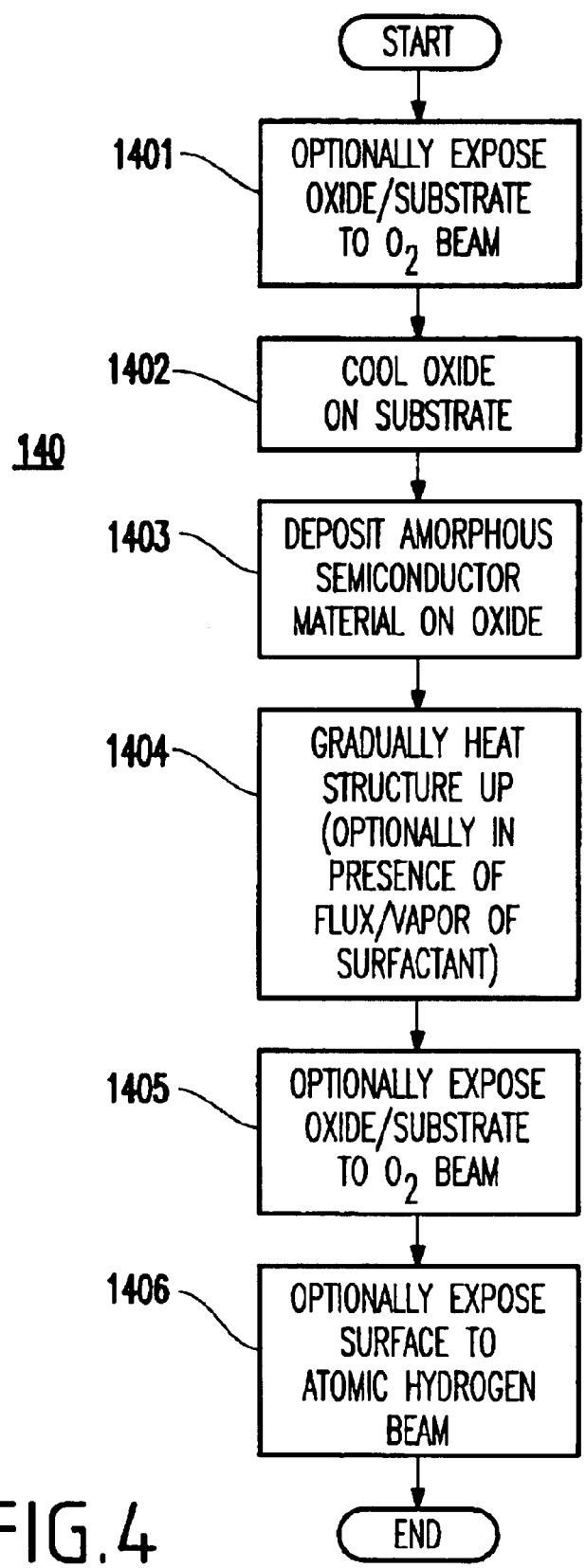
FIG. 4 illustrates a flowchart of a preferred method of performing a deposition of silicon (and/or Germanium or another semiconductor material) in step 140 of FIG. 1.

That is, while the above description generally describes depositing the silicon (or other semiconductor) epitaxially, hereinbelow and with reference to the flowchart of FIG. 4, a specific example of depositing this silicon epitaxially is provided which the present inventors have shown to be optimum thus far. It is noted that for ease of description below, silicon will be assumed to be the semiconductor material used, but of course as mentioned above and below, other materials can be used including germanium, or a mixture of germanium and silicon.

Thus, the invention provides a solid phase epitaxy of smooth semiconductor films on lattice matched insulating oxides.

As such, with the invention, a lattice-matched or near lattice-matched epitaxial oxide film is grown on a substrate (e.g., silicon or germanium). This oxide could be from the bixbyite, calcium fluorite, or pyrochlore structural classes, or it could be from the perovskite or perewskite structural classes. The important thing is that the material possesses an epitaxial relation with the underlying substrate (e.g., some of these oxides and their growth techniques are described above). The thickness of this oxide film can be from about 0.3 nm to about 2000 nm nominally, or even higher. Again, it is noted that instead of a silicon substrate, a germanium substrate can be employed.

Turning now to the method 1400, in a first optional step 1401, the oxide/substrate (e.g., silicon or germanium) is exposed to an $O_2$ beam.

In a step 1402, the oxide on the substrate (e.g., silicon or germanium) is cooled down to a predetermined low temperature in a vacuum system for deposition of an amorphous semiconductor. The specific temperature depends upon the semiconductor to be used.

For example, for Si it will be less than 500 C and for Ge it will be less than 300 C. A key aspect to this deposition is that the substrate temperature is low enough that the deposited silicon assumes an amorphous microstructure. Ideally, the lower the temperature the better, and preferably depositions are performed at room temperature.

In step 1403, a thin layer of semiconductor material (e.g., silicon, germanium, etc.) is then deposited upon the epitaxial oxide layer at room temperature.

Hereinbelow, using Si only for exemplary purposes and ease of description and not for limiting the invention in any way, the description of the method will proceed. However, it is noted that the inventive method has been performed using germanium.

The amorphous layer can be of any thickness. However, ideally it should be less than about 20 nm. In most applications, films of interest are only about 1–50 nm in thickness.

After amorphous semiconductor (e.g., Si, Ge, etc.) deposition, in step 1404, the amorphous silicon/oxide/substrate (e.g., Ge, Si, etc.) structure is gradually heated up to a temperature where the silicon starts crystallizing epitaxially. In this case, the seed for epitaxial crystallization is provided by the underlying crystalline oxide template. Above approximately 550 C, the amorphous silicon layer transforms to a single crystal epitaxial layer due to solid phase epitaxial growth seeded by the oxide surface below.

In the above-described way, the resulting solid phase epitaxial growth results in a rough silicon surface. However, in order for the solid phase epitaxy to proceed with a smooth silicon surface, the annealing for solid phase epitaxy preferably is performed in the presence of a vapor or flux of a surfactant such as antimony, magnesium, As, Be, Bi, P, B, N, Ga, Al, Si, C, and In.

It is noted that using the surfactant is a well-known method as described for example, in "Surfactants in epitaxial growth", M. Copel, M. C. Reuter, E. Kaxiras, R. M. Tromp, Phys. Rev. Lett. V63, 632 (1989).

As a result, a monolayer or less of the surfactant (antimony, etc.) covers the silicon surface, passivates it and prevents it from roughening. In this fashion, high quality silicon and germanium films have been grown on LaYO layers (e.g., the subject of parent application Ser. No. 09/898,039).

Electron microscopy and diffraction images of such layers have shown that the solid phase epitaxy of silicon commences in the 540–640 C range and that for Ge commences in the 380–480 C range.

Following solid phase epitaxy, an optional step 1405 may be performed in which the structure (e.g., oxide/substrate (e.g., silicon or germanium) is again exposed to an $O_2$ beam.

Further, following solid phase epitaxy (and with or without the optional step 1405), the Sb layer on the Si (or Ge) is now unwanted. It can be removed now by exposing the surface to an atomic hydrogen beam as shown in optional step 1406 by exposing the surface to an atomic hydrogen beam.

Atomic hydrogen beam sources are commercially available and use the principles of either passing molecular $H_2$ over a very hot filament, or passing it through a remote radio frequency (RF) plasma source. The hydrogen reduces Sb, and forms volatile $SbH_3$ that vaporizes. As noted above (e.g., in optional step 1405), it can be useful to oxidize the Sb prior to its reduction with $H_2$ as well. The inventors have produced X-ray photoelectron spectroscopy data that shows the removal of the surface Sb as a result of the hydrogen reduction.

Solid phase epitaxy of silicon itself is not new, neither is the knowledge of surfactant passivation of surfaces for smooth layers.

However, the novel aspects of the above method include: (i) in this case the solid phase epitaxy of the silicon is seeded by a crystalline oxide that was grown underneath, resulting in a silicon/epitaxial oxide/smooth epitaxial silicon or germanium film; (ii) this solid phase epitaxy is carried out in the presence of a vapor of a surfactant, and (iii) that an in-situ method has been discovered for removing the surfactant by reducing it with hydrogen once its role is over.

The surfactant alters the surface energy of the silicon, such that it does not roughen as a result of the solid phase epitaxy. Once the solid phase epitaxy has proceeded to completion, at the substrate temperature of above about 550 C, the surfactant vapor can be turned off.

As noted above, it may also be desired that following the oxide growth, an optional step 1405 is performed such that the oxide/silicon (or germanium) substrate is exposed to a molecular $O_2$ beam. This is performed if it is desired to grow a thin, amorphous silicon oxide layer at the interface between the crystalline oxide and silicon layer. It is typically carried out with the sample at a temperature of above 600 C in the deposition chamber in the presence of oxygen. The $O_2$ diffuses through the crystalline oxide layer and reacts with the Si forming a silicon oxide layer at the interface. This operation then results in a silicon substrate/silicon oxide/lattice matched oxide/Si (or Ge) smooth epitaxial film. One reason to do this is to form a pliant amorphous layer at the interface to accommodate film stresses.

Antimony (Sb) is but one example of a surfactant that can be used. The present inventors have found that other surfactants that can be used are As, Bi, P, B, N, Ga, Al, and/or In.

The present inventors have demonstrated these results using Si and Ge. The same can be done with GaAs. Only in this case, the surfactant would be one of Mg, Be, Si, C, Sb, As, and/or N.

Figure 2A:
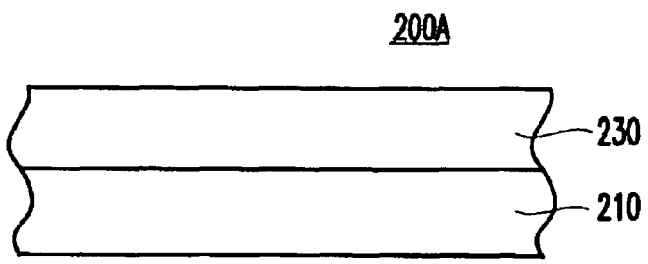
FIG. 2A illustrates a structure 200A of the invention in its most basic form.
Figure 2B:
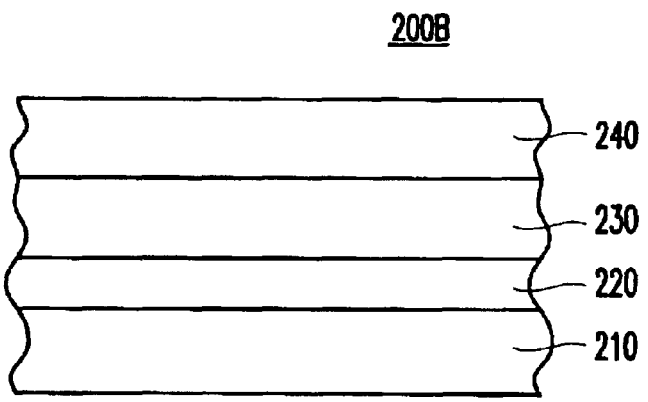
FIG. 2B illustrates a structure 200B formed by the method 100 of the present invention.

Returning now to FIG. 1A, the method 100 is completed, and the completed structure 200B is as shown in FIG. 2B.

That is, in FIG. 2B, silicon wafer 210 has the optional buffer layer 220 formed thereon. Then, the inventive compound $(La_xY_{1-x})_2O_3$ 230 is grown on the buffer layer 220 (or directly on the wafer 210), and a top silicon layer 240 is deposited on the inventive compound $(La_xY_{1-x})_2O_3$ 230. Such a structure would be a silicon-on-insulator structure. It is noted that the invention in its most basic form is the inventive compound 230 formed directly on the silicon wafer 210, as shown in FIG. 2A.

It is noted that the invention can be advantageously used to build multilayer stacks. That is, a stack could be built having a plurality of layers.

Figure 3:
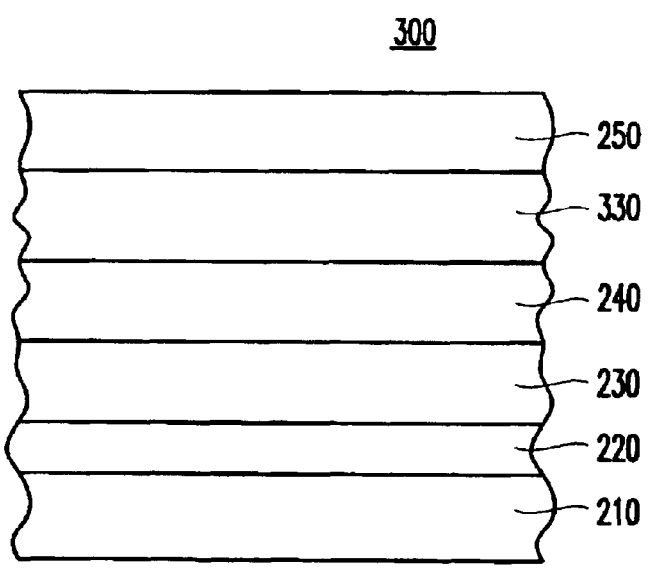
FIG. 3 illustrates another structure 300 of the method of the present invention including a multi-layer stack structure.

For example, FIG. 3 illustrates a structure 300 similar to that of FIG. 2B but in which an additional oxide layer 330 (which can have substantially or identically the same constituents as oxide layer 230, or in which a compound different from that of 230 can be used as described below) has been grown on top of the silicon layer 240, and then an additional silicon layer (not illustrated) would be formed, and so forth. It is noted that the layers of the figures are not necessarily drawn to scale. In the structure of FIG. 3, a Silicon quantum well (240) is formed, if the thickness of well 240 is less than about 20 nm. This quantum well can be the building block for resonant tunneling and light emitting devices.

Additionally, a resonant tunneling structure could be formed by forming the structure shown in FIG. 3, but by further forming another silicon layer 250 over oxide layer 330. The device would be based upon electrical current tunneling from Si layer 220 to layer 250, via the oxide layers and mediated by the Si quantum well 240.

Other resonant structures may be made by depositing additional oxide and Si layers 250, 340 and 260. If layers 250 and 240 are <20 nm thick, then a dual quantum well tunneling structure is produced and so on.

Thus, the inventors have grown an oxide/silicon multilayer structure that is an epitaxial heterostructure. Such a plurality of interleaved layers/structures can be used for novel devices.

For example, the inventive compound can be used for a gate dielectric for a metal oxide semiconductor field effect transistor (MOSFET) by taking silicon and growing an insulator on it, and then growing an epitaxial silicon layer on the insulator. If this epitaxial Si layer forms the channel of a transistor, then a silicon-on-insulator FET is formed.

Further, as alluded to above, the invention can be used to form a silicon on-insulator-based transistor with a gate dielectric on either side, or the inventive structures can be used for resonant tunneling devices (which are not transistors but are other devices) as briefly described above.

Additionally, the inventive structure could be used for an optical device in that the novel compound/silicon structure may be luminescent.

As an example of a multi-layer stack utilizing the structure of FIG. 3, with the Si layer 240 being less than 20 nm, a Si quantum well can be obtained, or a Si/oxide stack can be repeated, with the individual layer thickness being less than 5 nm, so that a super lattice structure that acts as a luminescent material is obtained.

Further, it is noted that the present invention is not limited to a mixed rare earth oxide of $(La_xY_{1-x})_2O_3$. The present invention also is equally applicable to other rare earth materials which could be fitted into the same philosophy in terms of looking at the lattice constants and matching them so that they could match silicon. Some other candidate materials and oxides which could be used are samarium (e.g., $(Sm_xY_{1-x})_2O_3$), cerium $(Ce_xY_{1-x})_2O_3$), Gadolinium $(La_xGd_{1-x})_2O_3$), Gadolinium oxide and Europium oxide (e.g., $(Gd_xEu_{1-x})_2O_3$), etc.

With the unique and unobvious aspects of the invention, new compounds have been developed in which as the yttrium oxide is growing a small amount of lanthanum (or other rare earth material as noted above) is added. The invention would find great benefit in microdevice structuring etc., due to its lattice matching with silicon.

While the invention has been described in terms of several preferred embodiments, those skilled in the art will recognize that the invention can be practiced with modification within the spirit and scope of the appended claims.

What is claimed is:

1. A semiconductor structure, comprising:
   a substrate;
   a crystalline oxide layer comprising single-crystal oxide formed over said substrate; and
   a smooth epitaxial silicon layer comprising single-crystal silicon formed on said crystalline oxide layer,
   wherein a lattice constant of said crystalline oxide is substantially a multiple of a lattice constant of silicon.
2. The structure of claim 1, further comprising:
   a silicon oxide layer formed between said substrate and said crystalline oxide layer.
3. The structure of claim 1, wherein the crystalline oxide layer comprises an oxide of at least one of the rare earth elements.
4. The structure of claim 1, wherein the crystalline oxide layer comprises an oxide of yttrium.
5. The structure of claim 1, wherein the crystalline oxide layer comprises a mixture of oxides of different rare earth elements and yttrium.
6. The structure of claim 1, further comprising:
   at least one additional layer of crystalline oxide formed on said epitaxial silicon layer; and
   at least one additional layer of silicon formed on said additional layer of crystalline oxide.
7. The structure of claim 1, wherein said substrate comprises a silicon substrate.
8. The structure of claim 1, wherein said crystalline oxide layer is formed directly on said substrate.
9. The structure of claim 1, wherein said crystalline oxide layer comprises an epitaxial oxide layer.
10. The structure of claim 1, wherein said crystalline oxide layer comprises a mixture of oxides of different rare earth elements.
11. The structure of claim 1, wherein said oxide layer crystallizes to have a bixbyite structure.
12. The structure of claim 1, wherein said crystalline oxide layer is perfectly lattice-matched to silicon.
13. The structure of claim 1, wherein said epitaxial silicon layer comprises a thickness in a range from 0.5 nm to 1 $\mu$m.
14. The structure of claim 1, wherein said crystalline oxide layer comprises $(La,Y)_2O_3$.
15. A semiconductor structure, comprising:
    a substrate;
    a crystalline oxide layer comprising single-crystal oxide formed over said substrate; and
    a smooth epitaxial germanium layer comprising single-crystal germanium formed on said crystalline oxide layer,
    wherein a lattice constant of said crystalline oxide is substantially a multiple of a lattice constant of silicon.
16. The structure of claim 15, further comprising:
    a silicon oxide layer formed between said substrate and said crystalline oxide layer.
17. The structure of claim 15, wherein the crystalline oxide layer comprises an oxide of at least one of the rare earth elements.
18. The structure of claim 15, wherein the crystalline oxide layer comprises an oxide of yttrium.
19. The structure of claim 15, wherein the crystalline oxide layer comprises a mixture of oxides of different rare earth elements and yttrium.
20. The structure of claim 15, further comprising:
    at least one additional layer of crystalline oxide formed on said epitaxial germanium layer; and
    at least one additional layer of germanium formed on said additional layer of crystalline oxide.
21. The structure of claim 15, wherein said substrate comprises a silicon substrate.
22. The structure of claim 15, wherein said crystalline oxide layer is formed directly on said substrate.
23. The structure of claim 15, wherein said crystalline oxide layer comprises an epitaxial oxide layer.
24. The structure of claim 15, wherein said crystalline oxide layer comprises a mixture of oxides of different rare earth elements.
25. The structure of claim 15, wherein said oxide layer crystallizes to have a bixbyite structure.
26. A semiconductor structure, including:
    a crystalline oxide surface comprising a single-crystal oxide surface; and
    an amorphous layer of at least one of silicon, germanium, gallium arsenide, aluminum arsenide, indium phosphide, aluminum antimonide, indium arsenide, gallium phosphide and mixed alloys thereof, deposited on said crystalline oxide surfare by evaporation or chemical vapor deposition,
    wherein said amorphous layer is deposited in the presence of a surfactant vapor, such that said amorphous layer forms a smooth epitaxial silicon layer when annealed, and
    wherein a lattice constant of said crystalline oxide is substantially a multiple of a lattice constant of silicon.
27. The structure of claim 26, further comprising:
    a silicon substrate, said crystalline oxide surface being formed directly on said silicon substrate.
28. The structure of claim 26, wherein said crystalline oxide surface comprises an epitaxial oxide surface.
29. The structure of claim 26, wherein said crystalline oxide surface comprises a surface of a mixture of oxides of different rare earth elements.
30. The structure of claim 26, wherein said crystalline oxide surface crystallizes to have a bixbyite structure.
31. The structure of claim 26, wherein said crystalline oxide surface is perfectly lattice-matched to silicon.

* * * * *